(12) United States Patent
Moschiano et al.

(10) Patent No.: US 8,630,125 B2
(45) Date of Patent: Jan. 14, 2014

(54) MEMORY CELL SENSING USING A BOOST VOLTAGE

(75) Inventors: Violante Moschiano, Bacoli (IT); Domenico Di Cicco, Avezzano (IT); Andrea D'Alessandro, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 118 days.

(21) Appl. No.: 13/151,456

(22) Filed: Jun. 2, 2011

(65) Prior Publication Data

US 2012/0307566 A1    Dec. 6, 2012

(51) Int. Cl.
*G11C 16/06* (2006.01)
(52) U.S. Cl.
USPC ............. 365/185.25; 365/185.03; 365/185.18
(58) Field of Classification Search
USPC ............................. 365/185.25, 185.03, 185.18
See application file for complete search history.

(56) References Cited

U.S. PATENT DOCUMENTS

| | | | |
|---|---|---|---|
| 5,696,717 A * | 12/1997 | Koh | ........................ 365/185.22 |
| 6,101,121 A | 8/2000 | Rolandi | |
| 6,198,344 B1 | 3/2001 | Sung | |
| 6,977,842 B2 | 12/2005 | Nazarian | |
| 7,009,889 B2 | 3/2006 | Tran et al. | |
| 7,403,423 B2 | 7/2008 | Marotta et al. | |
| 7,447,079 B2 | 11/2008 | Nguyen et al. | |
| 7,542,363 B2 * | 6/2009 | Kubo et al. | .................... 365/207 |
| 7,724,577 B2 | 5/2010 | Goda et al. | |
| 2004/0202023 A1 | 10/2004 | Chen et al. | |
| 2010/0008165 A1 | 1/2010 | Macerola et al. | |
| 2010/0232234 A1 | 9/2010 | Damle et al. | |

* cited by examiner

*Primary Examiner* — Huan Hoang
(74) *Attorney, Agent, or Firm* — Brooks, Cameron & Huebach, PLLC

(57) ABSTRACT

The present disclosure includes devices, methods, and systems including memory cell sensing using a boost voltage. One or more embodiments include pre-charging and/or floating a data line associated with a selected memory cell, boosting the pre-charged and/or floating data line, and determining a state of the selected memory cell based on a sensed discharge of the data line after boosting the data line.

21 Claims, 5 Drawing Sheets

MEMORY CELL SENSING USING A BOOST VOLTAGE

TECHNICAL FIELD

The present disclosure relates generally to semiconductor memory devices, methods, and systems, and more particularly, to memory cell sensing using a boost voltage.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among others.

Flash memory devices can be utilized as volatile and non-volatile memory for a wide range of electronic applications. Flash memory devices typically use a one-transistor memory cell that allows for high memory densities, high reliability, and low power consumption. Uses for flash memory include memory for solid state drives (SSDs), personal computers, personal digital assistants (PDAs), digital cameras, cellular telephones, portable music players (e.g., MP3 players) and movie players, among other electronic devices. Data, such as program code, user data, and/or system data, such as a basic input/output system (BIOS), are typically stored in flash memory devices.

Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to (and in some cases form) an access line, which is commonly referred to in the art as a "word line". However each memory cell is not directly coupled to a data line (which is commonly referred to as a digit line, e.g., a bit line, in the art) by its drain. Instead, the memory cells of the array are coupled together in series, source to drain, between a common source and a data line, where the memory cells commonly coupled to a particular data line are referred to as a "column".

Memory cells in a NAND array architecture can be programmed to a target (e.g., desired) state. For example, electric charge can be placed on or removed from a charge storage structure of a memory cell to put the cell into one of a number of programmed states. For example, a single level cell (SLC) can represent two states (e.g., 1 or 0). Flash memory cells can also store more than two states (e.g., 1111, 0111, 0011, 1011, 1001, 0001, 0101, 1101, 1100, 0100, 0000, 1000, 1010, 0010, 0110, and 1110). Such cells can be referred to as multilevel cells (MLCs). MLCs can allow the manufacture of higher density memories without increasing the number of memory cells since each cell can represent more than one digit (e.g., more than one bit). For example, a cell capable of representing four digits can have sixteen programmed states.

A state of a flash memory cell can be determined by sensing the stored charge on the charge storage structure (e.g., the threshold voltage) of the cell. The threshold voltage (Vt) of the cell can be a positive or negative voltage. That is, the cell can be programmed to a positive or a negative Vt level.

Sensing operations (e.g., read and/or program verify operations) can use sensing voltages to sense the Vt of flash memory cells and thereby determine the state of the cells. For example, to sense the Vt and determine the state of a cell programmed to a negative Vt level, a sensing operation can include applying a negative sensing voltage to a control gate of the cell, for instance. However, to generate the negative sensing voltage, additional and/or complex circuitry, such as, for instance, a negative voltage pump and/or isolated devices, may be needed. Such additional and/or complex circuitry needed to generate a negative sensing voltage can, for example, increase the size, increase the power consumption, and/or decrease the performance of a memory device.

DETAILED DESCRIPTION

Figure 1:
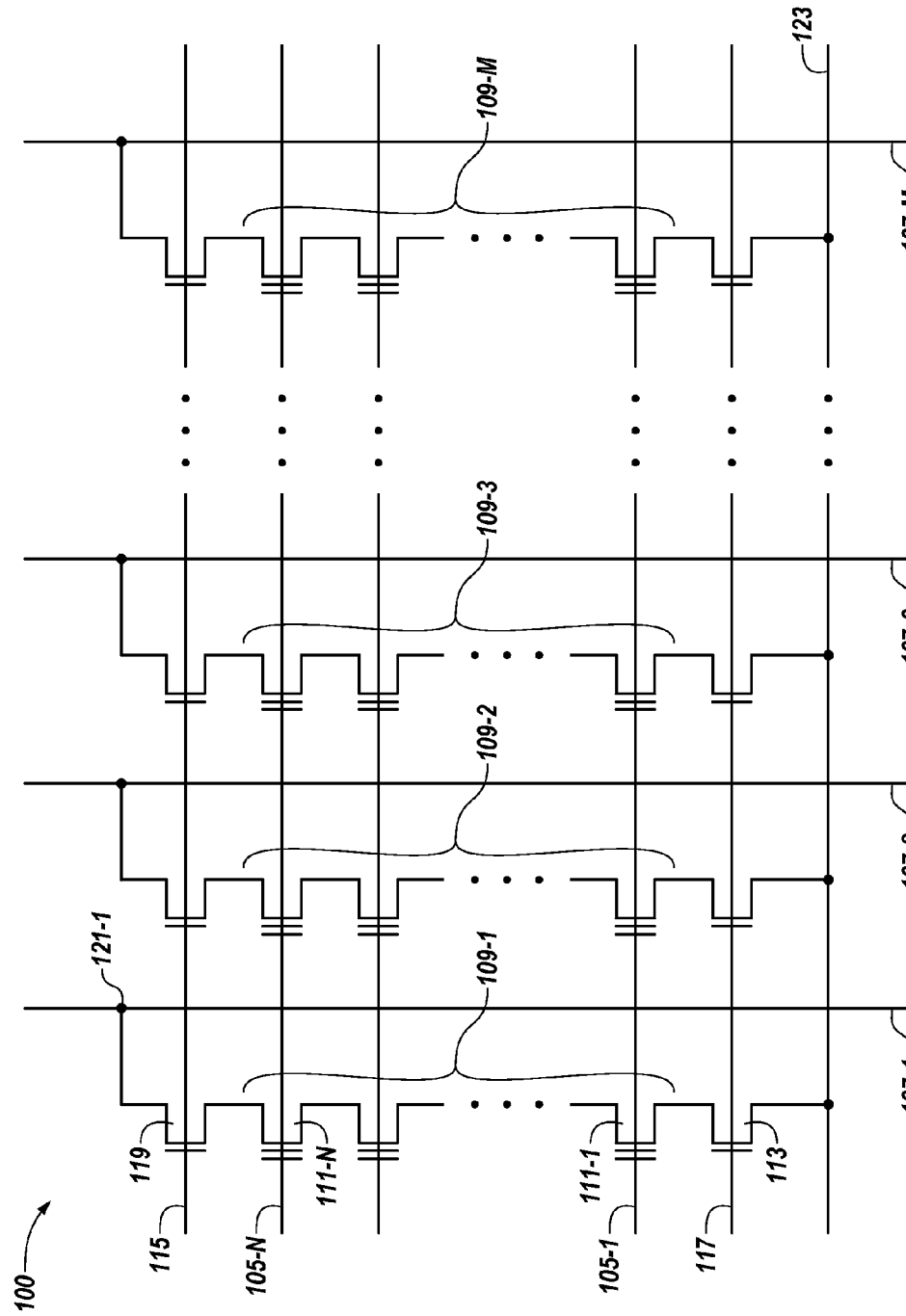
FIG. 1 is a schematic of a portion of a non-volatile memory array in accordance with one or more embodiments of the present disclosure.

The present disclosure includes devices, methods, and systems including memory cell sensing using a boost voltage. One or more embodiments include pre-charging and/or floating a data line associated with a selected memory cell, boosting the pre-charged and/or floating data line, and determining a state of the selected memory cell based on a sensed discharge of the data line after boosting the data line.

Embodiments of the present disclosure can be used to determine the state of memory cells having (e.g., programmed to) a negative threshold voltage (Vt) level without applying a negative sensing voltage to the cell. Determining the state of memory cells having a negative Vt level without applying a negative sensing voltage to the cells can provide benefits such as decreasing the size, decreasing the power consumption, and/or increasing the performance of a memory device, among other benefits.

Additionally, embodiments of the present disclosure can be used to determine the state of memory cells having negative Vt levels of greater magnitudes than previous approaches such as source side sensing and/or back bias sensing, for instance. Accordingly, embodiments of the present disclosure can provide the ability to sense memory cells having a wider range of Vts than such previous approaches, among other benefits.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory devices can refer to one or more memory devices. Additionally, the designators "N" and "M" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 600 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIG. 1 is a schematic of a portion of a non-volatile memory array 100 in accordance with one or more embodiments of the present disclosure. The embodiment of FIG. 1 illustrates a NAND architecture non-volatile memory array. However, embodiments described herein are not limited to this example. As shown in FIG. 1, the memory array 100 includes access lines (e.g., word lines 105-1, . . . , 105-N) and intersecting data lines (e.g., local bit lines 107-1, 107-2, 107-3, . . . , 107-M). For ease of addressing in the digital environment, the number of word lines 105-1, . . . , 105-N and the number of local bit lines 107-1, 107-2, 107-3, . . . , 107-M can be some power of two (e.g., 256) word lines by 4,096 bit lines.

Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a local bit line 107-1, 107-2, 107-3, . . . , 107-M. The non-volatile memory cells 111-1, . . . , 111-N of each NAND string 109-1, 109-2, 109-3, . . . , 109-M are connected in series source to drain between a source select gate (SGS) (e.g., a field-effect transistor (FET)) 113, and a drain select gate (SGD) (e.g., FET) 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N (e.g., a floating-gate transistor) of the corresponding NAND string 109-1.

In one or more embodiments, construction of the non-volatile memory cells 111-1, . . . , 111-N includes a source, a drain, a floating gate or other charge storage structure, and a control gate. The non-volatile memory cells 111-1, . . . , 111-N have their control gates coupled to a word line, 105-1, . . . , 105-N respectively. A "column" of the non-volatile memory cells, 111-1, . . . , 111-N, make up the NAND strings 109-1, 109-2, 109-3, . . . , 109-M, and are coupled to a given local bit line 107-1, 107-2, 107-3, . . . , 107-M, respectively. A "row" of the non-volatile memory cells are those memory cells commonly coupled to a given word line 105-1, . . . , 105-N. The use of the terms "column" and "row" is not meant to imply a particular linear (e.g., vertical and/or horizontal) orientation of the non-volatile memory cells. A NOR array architecture would be similarly laid out, except that the string of memory cells would be coupled in parallel between the select gates.

As one of ordinary skill in the art will appreciate, subsets of cells coupled to a selected word line (e.g., 105-1, . . . , 105-N) can be programmed and/or sensed (e.g., read) together as a group. A programming operation (e.g., a write operation) can include applying a number of program pulses (e.g., 16V-20V) to a selected word line in order to increase the threshold voltage (Vt) of selected cells coupled to that selected access line to a desired program voltage level corresponding to a target program state.

A sensing operation, such as a read or program verify operation, can include sensing a voltage and/or current change of a bit line associated with (e.g., coupled to) a selected cell in order to determine the state of the selected cell. For instance, the sensed voltage and/or current can correspond to a particular Vt level of the memory cell, which can correspond to one of a number of states. Sensing operations in accordance with one or more embodiments of the present disclosure will be further described below.

Figure 2:
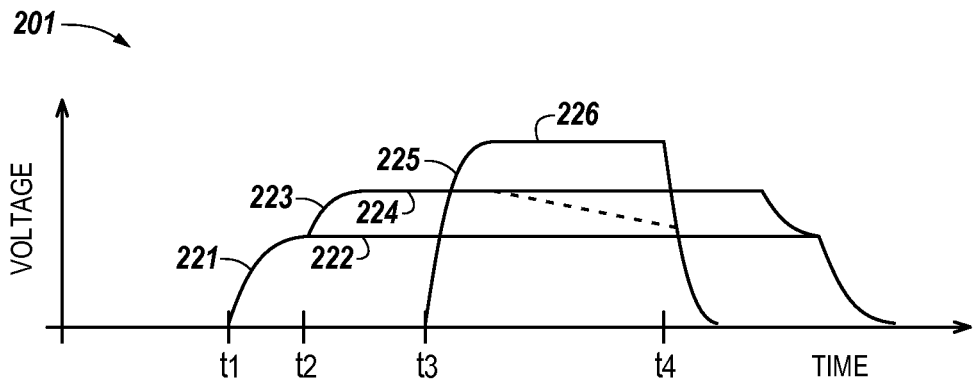
FIG. 2 illustrates a timing diagram associated with a sensing operation in accordance with a previous approach.

FIG. 2 illustrates a timing diagram 201 associated with a sensing operation in accordance with a previous approach. For instance, timing diagram 201 illustrates a number of voltage waveforms (e.g., voltage waveforms 221, 223, and 225) that can be associated with a back bias sensing approach.

Waveform 221 represents a voltage signal applied to a source line (e.g., a source voltage) associated with a selected memory cell during a sensing operation. At a time t1, the source line is increased to source voltage 222. However, previous approaches, such as a back bias sensing operation, may limit source voltage 222 to a particular maximum voltage in order to maintain a suitable drain to source voltage difference associated with the memory cell. As an example, a back bias sensing operation may include pre-charging the bit line of the selected cell to a supply voltage (e.g., Vcc) level of about 2.3 V, for instance, such that the Vcc voltage is applied to the drain of the cell. As such, the source voltage is limited to less than the 2.3 V Vcc level. For instance, source voltage 222 may be limited to a voltage not greater than about 1.5 V to 1.8 V, in order to maintain a drain to source voltage different of greater than about 0.4 V to 0.6 V.

Waveform 223 represents a voltage signal applied to a data line associated with the selected memory cell during the back bias sensing operation illustrated in FIG. 2. At a time t2, the data line is increased to a voltage 224. That is, the data line is pre-charged to voltage 224. Voltage 224 can have, for example, a magnitude equal to the sum of source voltage 222 and a data line clamp voltage (Vclamp), which can be used to clamp the data line voltage 224 to a particular level.

Waveform 225 represents a voltage signal applied to a source select gate (SGS) and a drain select gate (SGD) associated with the selected memory cell during the sensing operation. At a time t3, the SGS and SGD are increased to a voltage 226. Voltage 226 can have, for example, a magnitude equal to the sum of source voltage 222 and a select gate voltage (e.g., Vsg).

At time t3 (e.g., when the select gate waveform 225 transitions from low to high), the data line associated with the selected memory cell may begin to discharge, as represented by the dashed line illustrated in FIG. 2. At a time t4 (e.g., when the select gate waveform 225 transitions from high to low), the state of the selected memory cell can be determined based on the sensed discharge of the data line. That is, the state of the selected memory cell can be determined based on the discharge of the data line as determined by a sense amplifier, for instance.

During the back bias sensing operation illustrated in FIG. 2, a tub region and/or a well region of the semiconductor substrate associated with the selected memory cell may be grounded. For instance, a voltage of 0 V may be applied to the tub region and/or the well region of the semiconductor substrate during the sensing operation.

Figure 3:
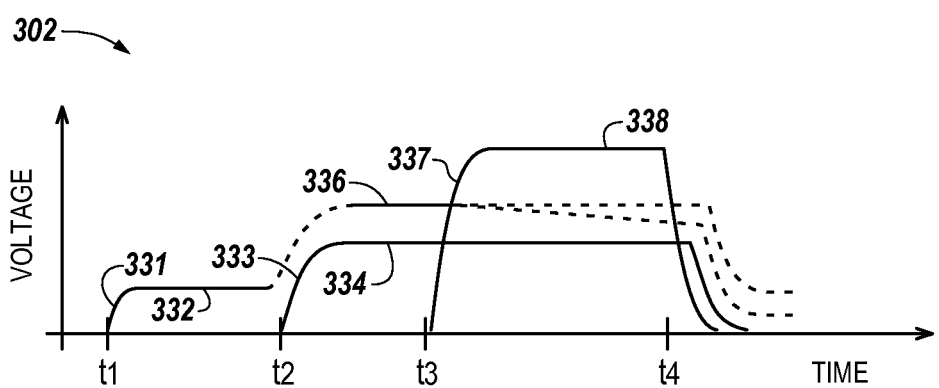
FIG. 3 illustrates a timing diagram associated with a sensing operation in accordance with one or more embodiments of the present disclosure.

FIG. 3 illustrates a timing diagram 302 associated with a sensing operation in accordance with one or more embodiments of the present disclosure. Timing diagram 302 illustrates a number of voltage waveforms (e.g., voltage waveforms 331, 333 and 337). The sensing operation can be performed on an array of memory cells, such as, for example, array 100 previously described in connection with FIG. 1.

Waveform 331 represents a voltage signal applied to a data line associated with a selected memory cell during a sensing operation in accordance with one or more embodiments of the present disclosure. At a time t1, the data line is pre-charged to a pre-charge voltage 332. Pre-charge voltage 332 can be a positive voltage such as, for example, 0.5 V. After time t1, the pre-charged data line can be floated, in one or more embodiments.

The selected memory cell can have (e.g., be programmed to) a negative threshold voltage (Vt). For example, the selected memory cell can have a Vt of between 0 V and −5.5 V. In one or more embodiments in which the Vt of a selected memory cell is negative, the cell can be associated with a state having only negative Vts associated therewith. However, embodiments of the present disclosure are not so limited. For instance, embodiments of the present disclosure can be used to sense memory cells having a Vt associated with a state having both negative and positive Vt levels associated therewith.

Waveform 333 represents a voltage signal applied to a source line associated with the selected memory cell during the sensing operation. At a time t2, the source line is boosted (e.g., increased) to boost voltage 334. Applying boost voltage 334 to the source line (e.g., increasing the source line to boost voltage 334) at time t2 can result in the pre-charged and/or floating data line being boosted from pre-charge voltage level 332 to a boosted data line voltage 336. That is, boosting the source line can boost the pre-charged and/or floating data line.

In contrast, in previous approaches, the data line associated with the selected memory cell is not pre-charged and/or floating when a source voltage (e.g., source voltage 222) is applied to the source line associated with the selected memory cell, as previously described herein. Rather, in previous approaches, a boosted source voltage (e.g., source voltage 222) is applied to the source line prior to a pre-charging or floating of the data line, as previously described herein.

Unlike the source voltage 222 previously described in connection with FIG. 2, the boosted source voltage 334 may not be limited to a voltage level below a particular voltage (e.g., Vcc). For instance, since the data line is boosted to a voltage 336, which is greater than the boosted source voltage 334, the boosted source voltage 334 can have a value equal to Vcc, for example. In one or more embodiments, the boosted source voltage 334 can be equal to a Vcc of about 2.4 V. However, embodiments of the present disclosure are not limited to a particular voltage 334. For instance, the voltage 334 can be greater or less than about 2.4 V, and may not be a Vcc voltage.

Applying boost voltage 334 to the source line can boost (e.g., increase) the voltage of the pre-charged data line to voltage 336. Voltage 336 can be the sum of the magnitude of the pre-charge voltage 332 and the boost voltage 334, in one or more embodiments. Because both pre-charge voltage 332 and boost voltage 334 can be positive voltages, voltage 336 (e.g., the sum of the magnitude of the pre-charge voltage 332 and the boost voltage 334) can be greater than boost voltage 334.

In some embodiments, a tub region and/or the well region of the semiconductor substrate associated with the selected memory cell can be increased to boost voltage 334 at time t2. Alternatively, in some embodiments, a ground voltage (e.g., 0 V) may be applied to the tub region and/or the well region of the semiconductor substrate during the sensing operation.

Waveform 337 represents a voltage signal applied to a source select gate (SGS) and a drain select gate (SGD) associated with the selected memory cell during the sensing operation. At a time t3, the SGS and the SGD are increased to a voltage 338. Voltage 338 can have, for example, a magnitude equal to the sum of boost voltage 334 and a select gate voltage (e.g., Vsg). Voltage 338 can be greater than voltage 336 (e.g., voltage 338 can be greater than the sum of pre-charge voltage 332 and boost voltage 334), as illustrated in FIG. 3.

At time t3 (e.g., when the select gate waveform 337 transitions from low to high), the data line associated with the selected memory cell may begin to discharge, as represented by the dashed lines illustrated in FIG. 3. The discharge of the data line may be (e.g., occur) in response to a discharge of the source line associated with the selected memory cell at time t3. That is, a discharge of the source line can be caused at time t3, and the data line may discharge in response to the discharge of the source line.

At a time t4 (e.g., when the select gate waveform 337 transitions from high to low), the state of the selected memory cell can be determined based on the sensed discharge of the data line associated with the selected memory cell. For example, the state of the selected memory cell can be determined based on the discharge of the data line as determined by a sense amplifier, for instance. The state of the selected memory cell can be, for example, a programmed state.

Accordingly, sensing operations in accordance with one or more embodiments of the present disclosure can determine the state of the selected memory cell without applying a negative voltage to the cell. For example, sensing operations in accordance with one or more embodiments of the present disclosure can determine the state of the selected memory cell without applying a negative voltage to an access line associated with the selected memory cell. Rather, sensing operations in accordance with one or more embodiments of the present disclosure can determine the state of the selected memory cell by applying only positive voltages (e.g., positive voltages 332, 334, 336, and 338) to the cell. Determining the state of the selected memory cell without applying a negative voltage to the cell can provide benefits such as decreasing the size, decreasing the power consumption, and/or increasing the performance of a memory device, among other benefits. Further, one or more embodiments of the present disclosure can provide the ability to determine the states of memory cells having a negative Vt greater in magnitude than previous approaches, which can provide an increased programming window, among other benefits.

Figure 4:
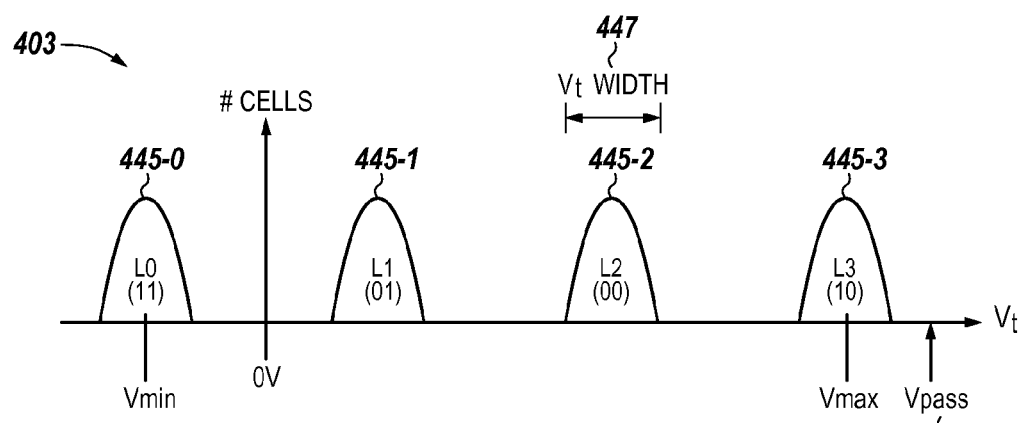
FIG. 4 illustrates a diagram of a number of threshold voltage distributions in accordance with a previous approach.

FIG. 4 illustrates a diagram 403 of a number of threshold voltage distributions in accordance with a previous approach.

The example shown in FIG. 4 can represent, for example, a number of two-bit (e.g., four-state) non-volatile memory cells.

As shown in FIG. 4, threshold voltage (Vt) distributions 445-0, 445-1, 445-2, and 445-3 represent four target states (e.g., L0, L1, L2, and L3, respectively) to which the memory cells can be programmed. As shown in FIG. 4, diagram 403 includes a range of voltage levels (e.g., Vmin to Vmax) to which the Vts of the memory cells can be programmed in order to represent the different target states.

In operation, the memory cells in a selected block can be erased together such that they have a Vt level within Vt distribution 445-0 prior to being programmed. As such, distribution 445-0 can be referred to as an erased state and can represent a particular stored data state (target state L0, e.g., stored data such as binary "11"). Target state L1 can correspond to data 01, target state L2 can correspond to data 00, and target state L3 can correspond to data 10. However, previous approaches are not limited to these data assignments.

Vt distributions 445-0, 445-1, 445-2, and 445-3 can represent a number of memory cells that are programmed to the corresponding target states, where the height of a Vt distribution curve indicates a number of cells programmed to a particular voltage within the Vt distribution, on average. The width 447 of the Vt distribution curve indicates the range of voltages that represent a particular target state (e.g., the width of the Vt distribution curve 445-2 for L2 represents the range of voltages that correspond to data 00).

Sensing operations in accordance with one or more previous approaches previously described herein (e.g., in connection with FIG. 2) can be performed to determine the state of the memory cells having a Vt (e.g., programmed) within the Vt distributions illustrated in FIG. 4. For example, sensing operations using the waveforms (e.g., waveforms 221, 223, and 225) and/or voltages (e.g., voltages 222, 224, and 226) associated with timing diagram 201 previously described in connection with FIG. 2 can be performed to distinguish between states L0, L1, L2, and L3 illustrated in FIG. 4.

However, sensing operations in accordance with one or more previous approaches previously described herein (e.g., in connection with FIG. 2) may not be able to determine the state of a memory cell having (e.g., programmed to) a Vt of less than −1.5 V. Accordingly, Vmin illustrated in FIG. 4 (e.g., the lowest Vt to which a memory cell may be programmed in such previous approaches) may not be less than −1.5 V. That is, the lower limit of the range of voltage levels to which the Vts of the memory cells can be programmed in such previous approaches may not be less than −1.5 V.

Figure 5A:
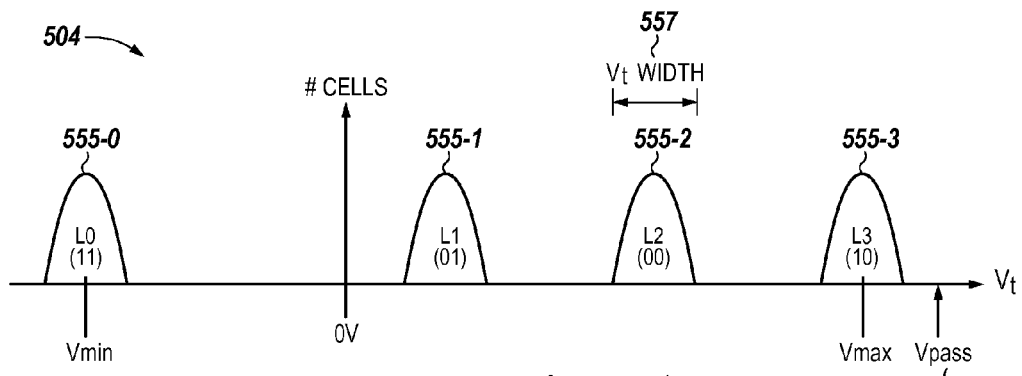
FIGS. 5A-5C illustrate a diagram of a number of threshold voltage distributions in accordance with one or more embodiments of the present disclosure.
Figure 5B:
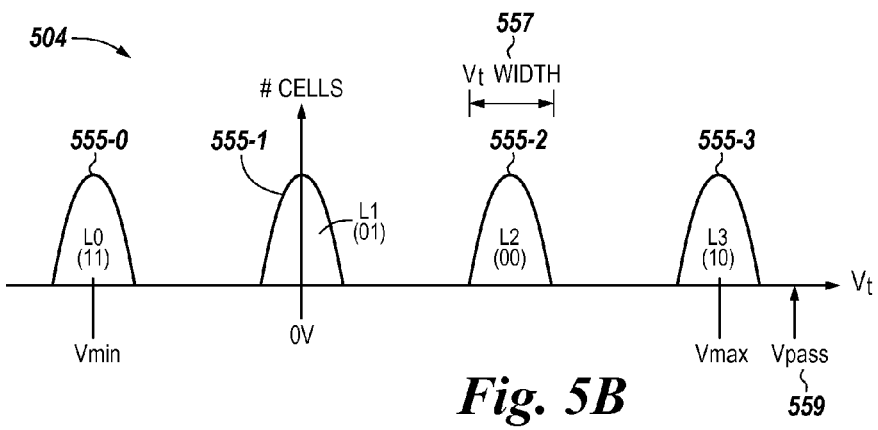
Figure 5C:
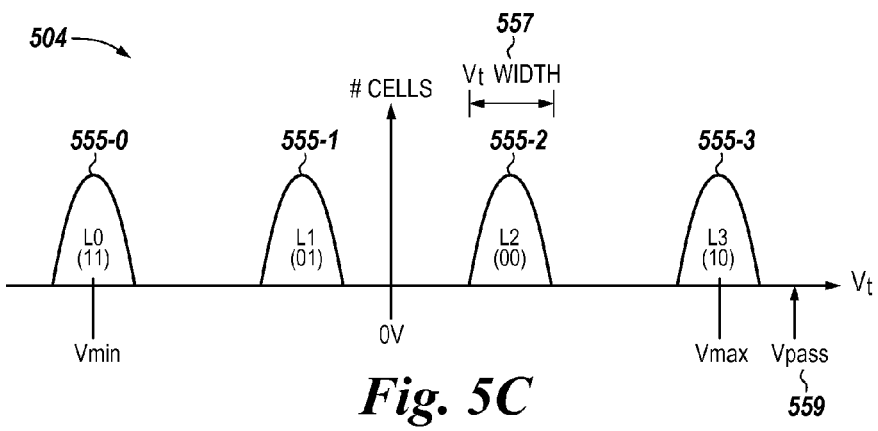

FIGS. 5A-5C illustrate a diagram 504 of a number of threshold voltage distributions in accordance with one or more embodiments of the present disclosure. The examples shown in FIGS. 5A-5C can represent, for example, memory cells 111-1, . . . , 111-N previously described in connection with FIG. 1. The examples shown in FIGS. 5A-5C represent two-bit (e.g., four-state) memory cells. However, embodiments of the present disclosure are not limited to this example of two-bit memory cells.

As shown in FIGS. 5A-5C, threshold voltage (Vt) distributions 555-0, 555-1, 555-2, and 555-3 represent four target states (e.g., L0, L1, L2, and L3, respectively) to which the memory cells can be programmed. As shown in FIGS. 5A-5C, diagram 504 includes a range of voltage levels (e.g., Vmin to Vmax) to which the Vts of the memory cells can be programmed in order to represent the different target states.

In operation, the memory cells in a selected block can be erased together such that they have a Vt level within Vt distribution 555-0 prior to being programmed. As such, distribution 555-0 can be referred to as an erased state and can represent a particular stored data state (target state L0, e.g., stored data such as binary "11"). Target state L1 can correspond to data 01, target state L2 can correspond to data 00, and target state L3 can correspond to data 10. However, embodiments of the present disclosure are not limited to these data assignments.

Vt distributions 555-0, 555-1, 555-2, and 555-3 can represent a number of memory cells that are programmed to the corresponding target states, where the height of a Vt distribution curve indicates a number of cells programmed to a particular voltage within the Vt distribution, on average. The width 557 of the Vt distribution curve indicates the range of voltages that represent a particular target state (e.g., the width of the Vt distribution curve 555-2 for L2 represents the range of voltages that correspond to data 00).

Sensing operations in accordance with one or more embodiments of the present disclosure can be performed to determine the state of the memory cells having a Vt (e.g., programmed) within the Vt distributions illustrated in FIGS. 5A-5C. For example, sensing operations using the waveforms (e.g., waveforms 331, 333, and 337) and/or voltages (e.g., voltages 332, 334, 336, and 338) associated with timing diagram 302 previously described in connection with FIG. 3 can be performed to distinguish between states L0, L1, L2, and L3 illustrated in FIGS. 5A-5C.

Sensing operations in accordance with one or more embodiments of the present disclosure can determine the state of a memory cell having (e.g., programmed to) a Vt of less than −1.5 V (e.g., to a Vt of −5.5 V). In contrast, sensing operations in accordance with previous approaches may not be able to determine the state of a memory cell having a Vt of less than −1.5 V, as previously described herein.

Accordingly, Vmin illustrated in FIGS. 5A-5C (e.g., the lowest Vt to which a memory cell may be programmed in accordance with one or more embodiments of the present disclosure) can be less than −1.5 V (e.g., can be −5.5 V). That is, the lower limit of the range of voltage levels to which the Vts of the memory cells can be programmed in accordance with one or more embodiments of the present disclosure can be less than −1.5 V (e.g., can be −5.5 V). In contrast, the lower limit of the range of voltage levels to which the Vts of the memory cells can be programmed in accordance with previous approaches may not be less than −1.5 V, as previously described herein.

Because sensing operations in accordance with one or more embodiments of the present disclosure can determine the state of memory cells programmed to a Vt of less than −1.5 V (e.g., to a Vt of −5.5 V), sensing operations in accordance with one or more embodiments of the present disclosure can sense memory cells having a wider range of Vts than sensing operations in accordance with previous approaches. For example, sensing operations in accordance with one or more embodiments of the present disclosure can determine the state of memory cells having negative Vt levels of greater magnitudes than sensing operations in accordance with previous approaches.

For example, as illustrated in the example shown in FIG. 5A, Vt distribution 555-0 (e.g., the erased state) can include negative Vts of greater magnitude than the negative Vts of Vt distribution 445-0 (e.g., the erased state) previously described in connection with FIG. 4. Accordingly, Vt distribution 555-1 (e.g., the L1 state) can include both positive and negative Vts, as illustrated in the example shown in FIG. 5B, or only negative Vts, as illustrated in the example shown in FIG. 5C. In contrast, Vt distribution 445-1 (e.g., the L1 state) previously described in connection with FIG. 4 may include only positive Vts. That is, Vt distribution 445-1 may not be able to include any negative Vts, as illustrated in FIG. 4.

Figure 6:
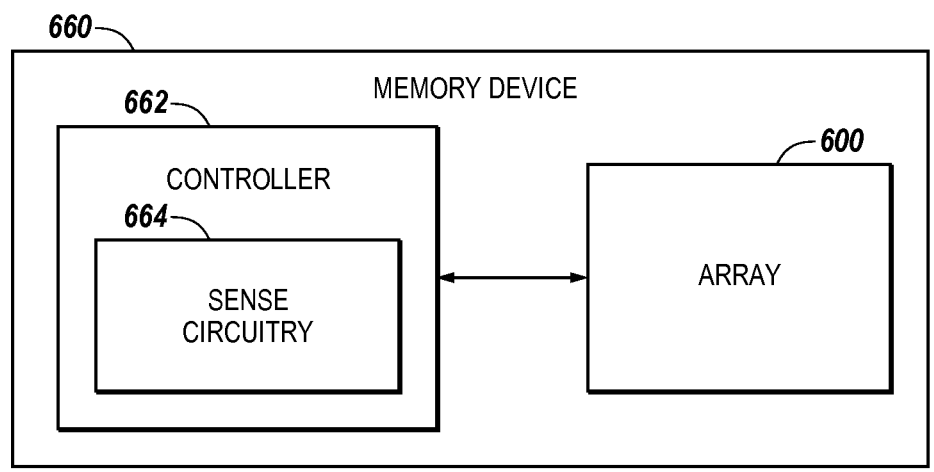
FIG. 6 illustrates a block diagram of a memory device in accordance with one or more embodiments of the present disclosure.

FIG. 6 illustrates a block diagram of a memory device 660 in accordance with one or more embodiments of the present disclosure. As shown in FIG. 6, memory device 660 includes a memory array 600 and a controller 662 coupled to memory array 600.

Memory array 600 can be, for example, memory array 100 previously described in connection with FIG. 1. Although one memory array is shown in FIG. 6, embodiments of the present disclosure are not so limited (e.g., memory device 660 can include more than one memory array coupled to controller 662).

Controller 662 can include, for example, control circuitry and/or firmware. For instance, controller 662 can include sense circuitry 664, as illustrated in FIG. 6. Controller 662 can be included on the same physical device (e.g., the same die) as memory array 600, or can be included on a separate physical device that is communicatively coupled to the physical device that includes memory array 600.

Sense circuitry 664 can perform sensing operations in accordance with one or more embodiments of the present disclosure to determine the state of the memory cells in memory array 600. For example, sense circuitry 664 can perform sensing operations on the memory cells in memory array 600 using the waveforms (e.g., waveforms 331, 333, and 337) and/or voltages (e.g., voltages 332, 334, 336, and 338) associated with timing diagram 302 previously described in connection with FIG. 3.

Sense circuitry 664 can be standard (e.g., unchanged) sense circuitry. For example, sense circuitry 664 may not include negative voltage circuitry (e.g., circuitry that can generate a negative sensing voltage). Such sense circuitry can decrease the size, decrease the power consumption, and/or increase the performance of memory device 660, among other benefits.

The embodiment illustrated in FIG. 6 can include additional circuitry that is not illustrated so as not to obscure embodiments of the present disclosure. For example, memory device 660 can include address circuitry to latch address signals provided over I/O connectors through I/O circuitry. Address signals can be received and decoded by a row decoder and a column decoder, to access memory array 600. It will be appreciated by those skilled in the art that the number of address input connectors can depend on the density and architecture of memory device 660 and/or memory array 600.

CONCLUSION

The present disclosure includes devices, methods, and systems including memory cell sensing using a boost voltage. One or more embodiments include pre-charging and/or floating a data line associated with a selected memory cell, boosting the pre-charged and/or floating data line, and determining a state of the selected memory cell based on a sensed discharge of the data line after boosting the data line.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of sensing a memory cell, comprising:
   pre-charging a data line associated with a selected memory cell;
   boosting the pre-charged data line by:
      floating the pre-charged data line; and
      applying a boost voltage to a source line associated with a plurality of strings of memory cells, wherein one of the strings includes the selected memory cell, while floating the pre-charged data line; and
   determining a state of the selected memory cell based on a sensed discharge of the data line after boosting the data line.

2. The method of claim 1, wherein:
   the selected memory cell has a negative threshold voltage; and
   the method includes determining the state of the selected memory cell without applying a negative voltage to the selected memory cell.

3. The method of claim 1, wherein the sensed discharge of the data line is in response to a discharge of the source line.

4. The method of claim 1, wherein pre-charging the data line includes applying a pre-charge voltage to the data line.

5. The method of claim 4, wherein boosting the pre-charged data line increases a voltage associated with the data line to a sum of the magnitude of the pre-charge voltage and a boost voltage.

6. A method of sensing a memory cell, comprising:
   pre-charging a data line associated with a selected memory cell having a negative threshold voltage;
   boosting the pre-charged data line by:
      floating the pre-charged data line; and
      applying a boost voltage to a source line associated with a plurality of strings of memory cells, wherein one of the strings includes the selected memory cell, while floating the pre-charged data line; and
   determining a state of the selected memory cell based on a sensed discharge of the data line responsive to boosting the pre-charged data line and without applying a negative voltage to the selected memory cell.

7. The method of claim 6, wherein determining the state of the selected memory cell includes determining the state of the selected memory cell without applying a negative voltage to an access line associated with the selected memory cell.

8. The method of claim 6, wherein the selected memory cell has a threshold voltage of less than approximately −1.5 Volts.

9. The method of claim 8, wherein the selected memory cell has a threshold voltage of less than approximately −5.5 Volts.

10. The method of claim 6, wherein the state of the selected memory cell is an erased state.

11. The method of claim 6, wherein the state of the selected memory cell is a programmed state.

12. The method of claim 6, wherein the selected memory cell has a negative threshold voltage that is within a threshold voltage distribution that includes only negative threshold voltages.

13. The method of claim 6, wherein the selected memory cell has a negative threshold voltage that is within a threshold voltage distribution that includes positive and negative threshold voltages.

14. A method of sensing a memory cell, comprising:
applying a pre-charge voltage to a data line associated with the selected memory cell;
floating the pre-charged data line;
boosting the floating data line to a sum of the magnitude of the pre-charge voltage and a boost voltage by applying the boost voltage to a source line associated with a plurality of strings of memory cells, wherein one of the strings includes the selected memory cell;
causing a discharge of the source line after applying the boost voltage to the source line; and
determining a state of the selected memory cell based on a sensed discharge of the data line in response to the discharge of the source line.

15. The method of claim 14, wherein the pre-charge voltage and the boost voltage are positive voltages.

16. The method of claim 14, wherein the sum of the magnitude of the pre-charge voltage and the boost voltage is greater than the boost voltage.

17. The method of claim 14, wherein the method includes applying the boost voltage to a well region of a semiconductor substrate associated with the selected memory cell while floating the pre-charged data line.

18. The method of claim 14, wherein the method includes applying the boost voltage to a tub region of a semiconductor substrate associated with the selected memory cell while floating the pre-charged data line.

19. The method of claim 14, wherein the method includes applying a voltage that is greater than the sum of the magnitude of the pre-charge voltage and the boost voltage to a drain select gate and a source select gate associated with the selected memory cell while causing the discharge of the source line.

20. The method of claim 14, wherein the boost voltage is at least approximately 2.4 Volts.

21. The method of claim 14, wherein the boost voltage is approximately equal to a supply voltage level.

* * * * *

UNITED STATES PATENT AND TRADEMARK OFFICE
CERTIFICATE OF CORRECTION

PATENT NO.        : 8,630,125 B2
APPLICATION NO.   : 13/151456
DATED             : January 14, 2014
INVENTOR(S)       : Violante Moschiano et al.

Page 1 of 1

It is certified that error appears in the above-identified patent and that said Letters Patent is hereby corrected as shown below:

On the title page, item (74), in "Attorney, Agent, or Firm", in column 2, line 2, delete "Huebach," and insert -- Huebsch, --, therefor Signed and Sealed this
Twenty-fifth Day of March, 2014

Michelle K. Lee
*Deputy Director of the United States Patent and Trademark Office*